US006924583B2

United States Patent
Lin et al.

(12) United States Patent
(10) Patent No.: US 6,924,583 B2
(45) Date of Patent: Aug. 2, 2005

(54) FILM BULK ACOUSTIC DEVICE WITH INTEGRATED TUNABLE AND TRIMMABLE DEVICE

(75) Inventors: Chung-Hsien Lin, Hsinchu (TW); Shu-Hui Tsai, Hsinchu (TW); Chen-Hsun Du, Hsinchu (TW); Ruey-Shing Hunag, Hsinchu (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 108 days.

(21) Appl. No.: 10/253,861

(22) Filed: Sep. 25, 2002

(65) Prior Publication Data

US 2003/0205948 A1 Nov. 6, 2003

(30) Foreign Application Priority Data

May 3, 2002 (TW) ........................ 91109279 A

(51) Int. Cl.[7] ..................... H01L 41/04; H01L 27/02
(52) U.S. Cl. ................ 310/324; 310/320; 310/312; 310/366
(58) Field of Search ................ 310/312, 320, 310/324, 365, 366

(56) References Cited

U.S. PATENT DOCUMENTS

| 5,166,646 | A | * | 11/1992 | Avanic et al. | ........... | 331/107 A |
| 5,587,620 | A | * | 12/1996 | Ruby et al. | .................. | 310/346 |
| 6,653,913 | B2 | * | 11/2003 | Klee et al. | .................... | 333/188 |
| 6,710,681 | B2 | * | 3/2004 | Figueredo et al. | .......... | 333/187 |
| 6,762,471 | B2 | * | 7/2004 | Kim | ........................... | 257/414 |

* cited by examiner

*Primary Examiner*—Thomas M. Dougherty
(74) *Attorney, Agent, or Firm*—Troxell Law Office, PL

(57) ABSTRACT

A film bulk acoustic device having integrated trimmable device comprises a FBAR and a integrated tunable and trimmable device being integrated on a common substrate, at least a common electrode or piezoelectric layer. By trimming the integrated trimmable device or the FBAR and alter either the capacitance or inductance of the integrated trimmable device until the film bulk acoustic device having integrated trimmable device achieves the target resonance frequency. By taking advantage of the electrostatic force, the integrated tunable device is capable of providing tuning until the film bulk acoustic device having integrated tunable device achieves the target resonance frequency.

11 Claims, 13 Drawing Sheets

FILM BULK ACOUSTIC DEVICE WITH INTEGRATED TUNABLE AND TRIMMABLE DEVICE

FIELD OF THE INVENTION

The present invention relates to a film bulk acoustic device and in particular relates to a film bulk acoustic device capable of integrating tunable and trimmable device and providing wafer-level tuning and trimming of film bulk acoustic resonator (FBAR).

BACKGROUND OF THE INVENTION

Film bulk acoustic resonator (hereafter FBAR) is an advanced resonator. As shown in FIG. 1A, a FBAR 10 has a metal layer 11—piezoelectric layer (hereafter PZ layer) 12—metal layer 13 structure formed by thin film semiconductor processes in a controlled environment, the PZ layer 12 being an aluminum nitride or a zinc oxide layer, and the metal layers 11 and 13 being connected with a first electrode 14 and a second electrode 15, respectively. When alternating voltage is applied across the first electrode 14 and the second electrode 15, resonance is generated as a result of expansions and contractions within the aluminum nitride or zinc oxide layer in response to the alternating voltage. Since Surface Acoustic Wave Devices (hereafter SAWs) only employ surface area to produce resonance, FBARs possess superior power handling capacity, especially in high frequency regions, owing to the fact that the bulk of the aluminum nitride or zinc oxide layer is engaged in resonance generation. In high frequency operation, the dimension of SAWs' interdigitated structure has to be greatly reduced, demanding highly sophisticated processes. For high frequency applications such as filters, duplexers and oscillators, FBARs owns superior device characteristics.

FIG. 1B shows an input impedance curve of a FBAR 10 as a function of alternating voltage, $f_r$ and $f_a$ being resonance frequency and anti-resonance frequency, respectively. When metal layer 11, PZ layer 12 and metal layer 13 are formed as a result of imperfect thin film semiconductor processes, resonance frequency and anti-resonance frequency shifting often occurs, making quality assurance a major challenge.

The following lists a number of prior art tuning methods for FBARs:

1) U.S. Pat. No. 5,873,153 'Method of Making Tunable Thin Film Acoustic Resonators' by Ruby et al. discloses that, constructed on a thin membrane 201, a FBAR 20 (See FIG. 2A) includes bottom and top electrodes 204 and 203, respectively, which sandwich a portion of sheet of PZ material 202. The temperature of the PZ material 202 is controlled by resistive heating elements 205 and 206. The patent reports, by altering the temperature of a FBAR over a range of 200° C., a frequency shift of 4% may be obtained. The method, however, has two deficiencies:
   1. The tunable resonance range is limited
   2. Resistive heating equals energy consumption Referring to FIG. 2B, the patent also takes advantage of reducing a acoustical path 222 in order to achieve increased resonance frequency of a FBAR 22. What it does is to incorporate an additional layer 221, which is a conductor having a high resistivity, on the underside of FBAR 22. In this embodiment of the prior art patent, the fabrication parameters are chosen such that FBAR 22 has a resonance frequency that is slightly below the desired frequency. In post fabrication testing, the frequency is measured as material from layer 221 is evaporated and acoustical path 222 is reduced until the frequency increases to the desired value. The embodiment also has two drawbacks:
   3. Resonance tuning only take place in vacuum
   4. Requires sophisticated tuning techniques 2) U.S. Pat. No. 6,051,907 'Method for Performing On-wafer Tuning of Thin Film bulk Acoustic Wave Resonators (FBARS)' by Ylilammi illustrates the manner in which the series resonant frequencies exhibited by an FBAR are related to various thickness of an added layer of piezoelectric material that is formed of zinc-oxide (ZnO). The prior patent demonstrates that an additional zinc-oxide layer having a thickness of 149 nm needs to be formed over a selected portion of the FBAR having a series resonant frequency of 994.28 MHz in order to tune the series resonant frequency to a target series resonant frequency of 954.6 MHz. The disadvantage is that a slight variation in thickness can result in considerable change in resonant frequency. Hence, the prior art patent shares the same drawbacks of items 3 and 4:
   3. Resonance tuning only take place in vacuum
   4. Requires sophisticated tuning techniques 3) U.S. Pat. No. 5,166,646 'Integrated Tunable Resonators for use in Oscillators and Filters' by Avanic et al. illustrates a resonator 31, comprising a FBAR 30 and a Voltage Variable Capacitor or VVC 32. The VVC 32 comprises a heavily doped semiconductor layer 322 on a common substrate 321, an upper electrode 324 on an insulator layer 206 and a lower electrode 325 on the underside of VVC 32. A reverse bias voltage applied between electrodes 324 and 325 results in the formation of a depletion region 326. The variations in the width of this depletion region 326 provide a large variation in the tuning capacitor coupled to the FBAR 30. It is this characteristic of the VVC 32 that renders the FBAR 30 tunable. By varying reverse bias voltage, the operating frequency of the FBAR 30 and hence the resonator 31 may be changed resulting in a tunable resonator. As the reverse biased voltage applied between 324 and 325 is varied so will the reactance of the VVC 32 and hence the operating frequency of the resonator 31. The tunable resonator 31, however, has two deficiencies:
   1. The VVC 32 is a varactor, which is an active component, and will thus increase the overall noise of the tunable resonator 31
   2. The application of semiconductor characteristics of the common substrate 321 prevents usage of non-semiconductor substrates The present invention has been accomplished with a view to overcoming the above-mentioned problems experienced with conventional technologies.

SUMMARY OF THE INVENTION

An object of the present invention is to provide a film bulk acoustic device capable of integrating tunable and trimmable device, as well as wafer-level tuning and trimming, thereby offering cost reduction, reliability and stability.

Another object of the present invention is to provide a FBAR having integrated tunable device.

The third object of the present invention is to provide a FBAR having integrated trimmable device.

The fourth object of the present invention is to provide a FBAR having integrated tunable and trimmable device.

The fifth object of the present invention is to provide a FBAR having integrated tunable and trimmable device and capable of providing wafer-level testing.

The following Description and Designation of Drawings are provided in order to help understand the features and content of the present invention.

BRIEF DESCRIPTION OF THE DRAWINGS

The accompanying drawings form a material part of this description, in which.

DETAILED DESCRIPTION OF THE PREFERRED EMBODIMENT

In the following description, the present invention is described in connection with specific and preferred embodiments. It will be understood that the present invention is not limited to these embodiments, but rather is to be construed to be of the spirit and scope defined by the appended claims.

In the present specification, the structure and process are described as comprising specific components and steps, respectively. It is within the contemplation of the present inventors that the structure and process can consist essentially of, or consist of, the disclosed components and steps, respectively.

A FBAR having integrated tunable and trimmable device in accordance with the fist, second, third, fourth and fifth preferred embodiment of the present invention is shown in FIG. 4, FIG. 5A, FIG. 6A, FIG. 7A and FIG. 8, respectively. The right hand side of those five figures is a prior art FBAR. The left hand side of the five figures discloses the structure of integrated tunable and/or trimmable device in accordance with the fist through the fifth preferred embodiment of the present invention, respectively.

First Preferred Embodiment

Figure 4:
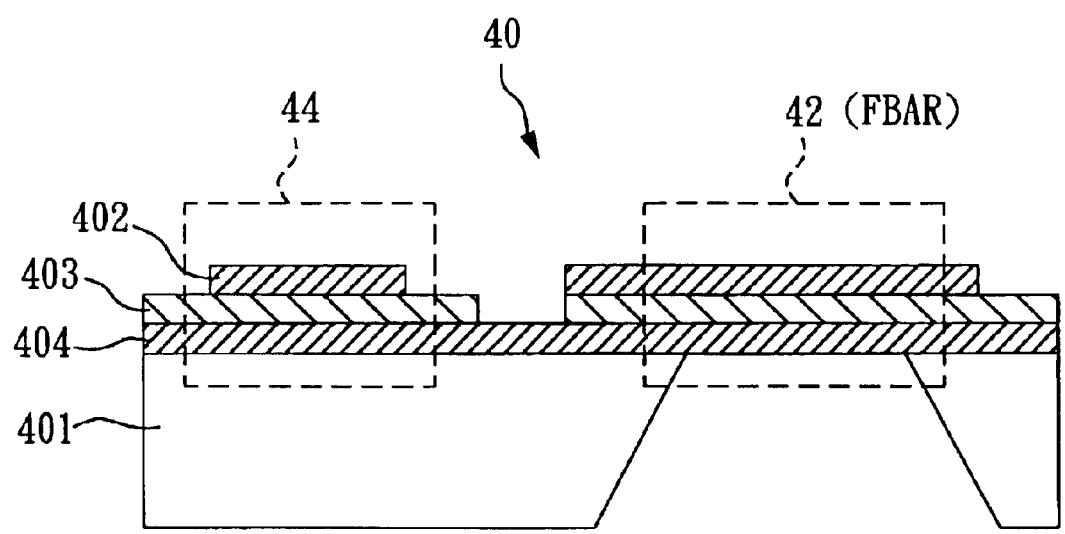
FIG. 4 is a side view of prior art integrated trimmable resonator in accordance with the first embodiment of the present invention.

Referring to FIG. 4, a film bulk acoustic device 40 having integrated trimmable device in accordance with the first embodiment of the present invention comprises a FBAR 42 and an integrated trimmable device 44, being integrated on the left side of the FBAR 42. Provided on a common substrate 401, the integrated trimmable device 44 has an upper electrode 402, a PZ layer 403 and an integrated lower electrode 404. A dielectric layer may replace the PZ layer 403. Being proportional to the area of the upper electrode 402, the capacitance of the integrated trimmable device 44 can be adjusted by trimming the area of the upper electrode 402 until the film bulk acoustic device 40 having integrated trimmable device achieves the target resonance frequency.

Second Preferred Embodiment

Figure 5A:
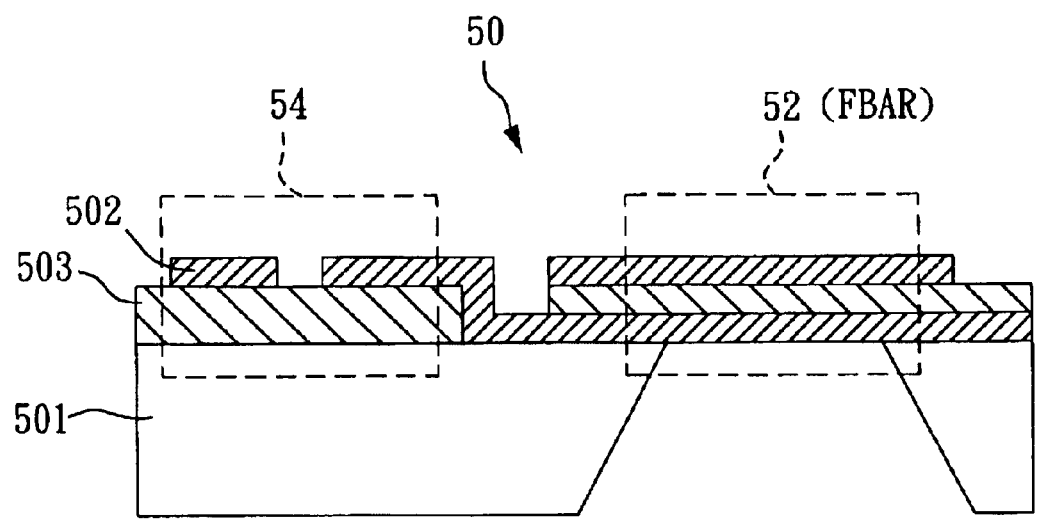
FIG. 5A is a side view of prior art integrated trimmable resonator in accordance with the second embodiment of the present invention.
Figure 5B:
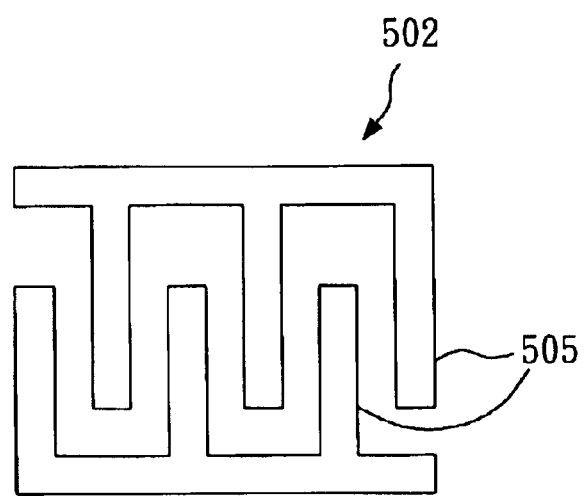
FIG. 5B is a top view of the integrated trimmable device in accordance with the second embodiment of the present invention.

Referring to FIG. 5A, a film bulk acoustic device 50 having integrated trimmable device in accordance with the second embodiment of the present invention comprises a FBAR 52 and an integrated trimmable device 54, being integrated on the left side of the FBAR 52. Provided on a common substrate 501, the integrated trimmable device 54 has an interdigitated upper electrode 502 (See FIG. 5B), a PZ layer 503 and a integrated lower electrode 504. A dielectric layer may replace the PZ layer 503. Being proportional to the bordering finger electrodes 505 of the upper electrode 502, the capacitance of the integrated trimmable device 54 can be adjusted by trimming the bordering finger electrodes 505 of the upper electrode 502 until the film bulk acoustic device 50 having integrated trimmable device achieves the target resonance frequency.

Figure 8:
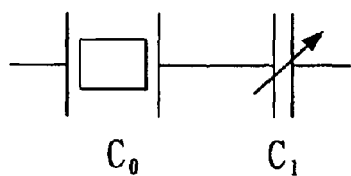
FIG. 8 is the resonance frequency curve of the film bulk acoustic device having integrated trimmable device in accordance with the first and second embodiment of the present invention.
Figure 8:
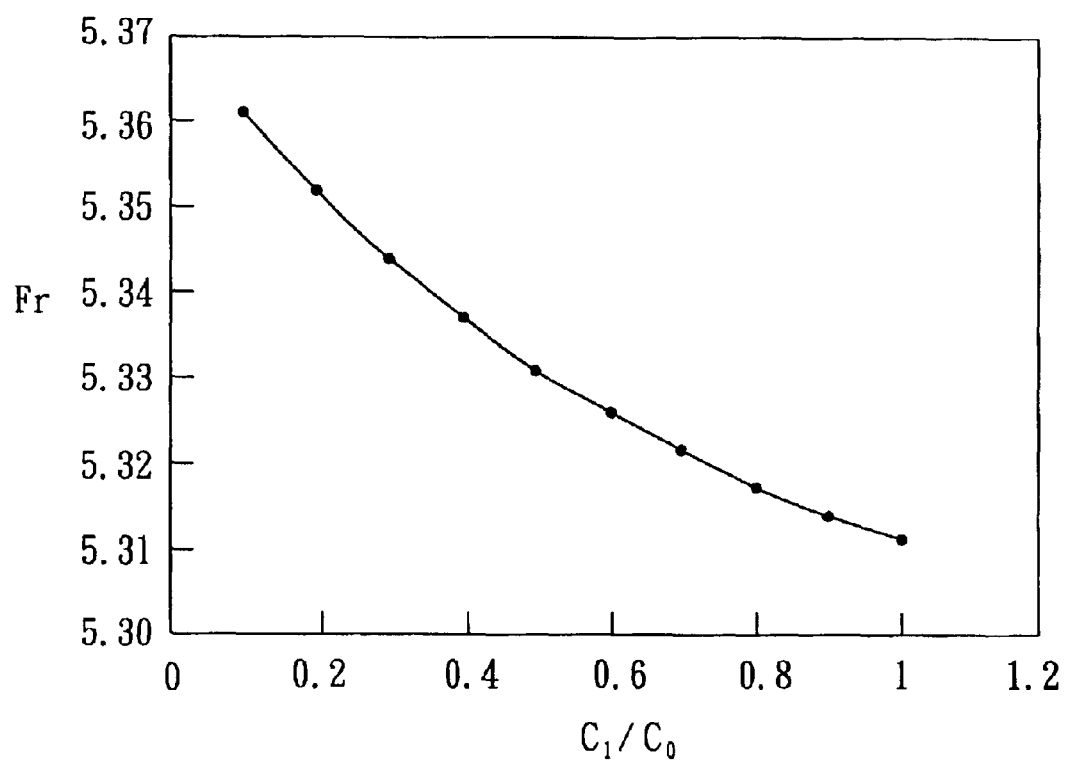

FIG. 8 shows the resonance frequency curve of the film bulk acoustic device 40 and 50 having integrated trimmable device in accordance with the first and second embodiment of the present invention, the vertical and horizontal axis representing the resonance frequency fr and the ratio $C_1/C_0$ of the capacitance $C_1$ of the integrated trimmable device 44 or 54 and the capacitance $C_0$ of the FBAR 42 or 52. When the ratio $C_1/C_0$ increases, the resonance frequency fr of the film bulk acoustic device 40 and 50 decreases. In the first and the second embodiment, trimming the capacitance $C_1$ or $C_0$, and altering the ratio $C_1/C_0$ can help the film bulk acoustic device 40 and 50 achieve the desired resonance frequency fr. The capacitance $C_1$ of the integrated trimmable device 44 or 54 is measured between the upper electrode 402 or 502 and the integrated lower electrode 404. The capacitance $C_O$ of the FBAR 42 or 52 is measured between the upper (not shown) and the integrated lower electrode 404 or 504.

Third Preferred Embodiment

Figure 6A:
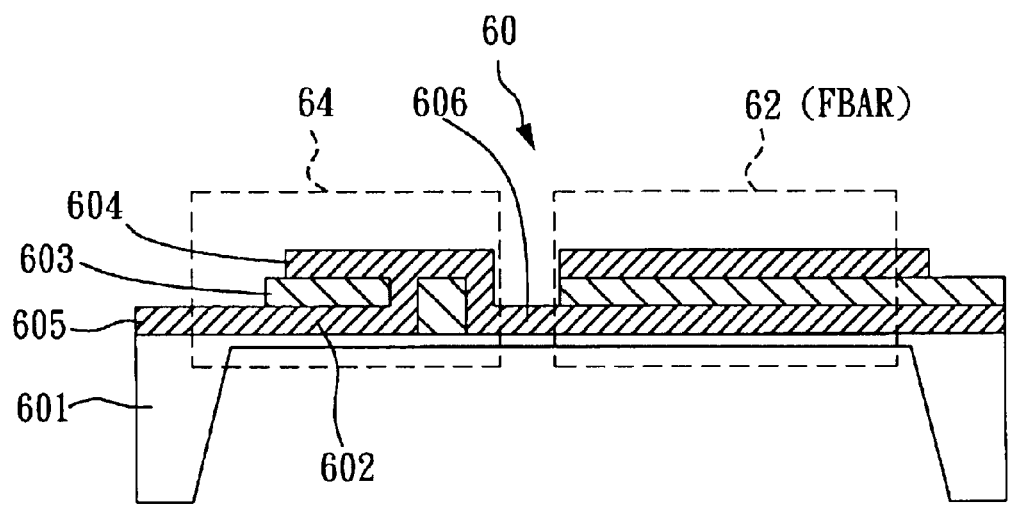
FIG. 6A is a side view of the film bulk acoustic device with integrated trimmable device in accordance with the third embodiment of the present invention.
Figure 6B:
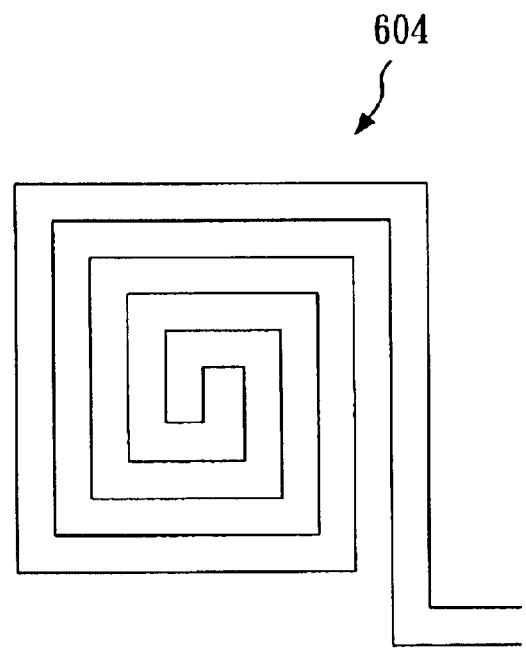
FIG. 6B is a top view of the integrated trimmable device in accordance with the third embodiment of the present invention.

Referring to FIG. 6A, a film bulk acoustic device 60 having integrated trimmable device in accordance with the third embodiment of the present invention comprises a FBAR 62 and an integrated trimmable device 64, being integrated on the left side of the FBAR 62. Provided on a common substrate 601, the integrated trimmable device 64 has a electrode, the first end 602 of the electrode being integrated on the common substrate 601, connected with the FBAR 62 a extended upward to form a spiral electrode 604 and a PZ layer 603. A dielectric layer may replace the PZ layer 603. Having a relationship with the geometrical shape of the spiral electrode 604 (See FIG. 6B), or meander electrode (FIG. 7B) the inductance of the integrated trimmable device 64 can be adjusted by trimming the inductance of the spiral or meander electrode 604 until the bulk acoustic device 60 having integrated trimmable device achieves the target resonance frequency. The inductance of the integrated trimmable device 64 is measured across the left side 605 of the first end 602 of the electrode and the borderline 606 between the electrode and the FBAR 62. The equivalent inductance of the equivalent circuit the FBAR 62 is measured across the upper electrode (not shown) and the lower electrode (not shown).

Fourth Preferred Embodiment

Figure 7A:
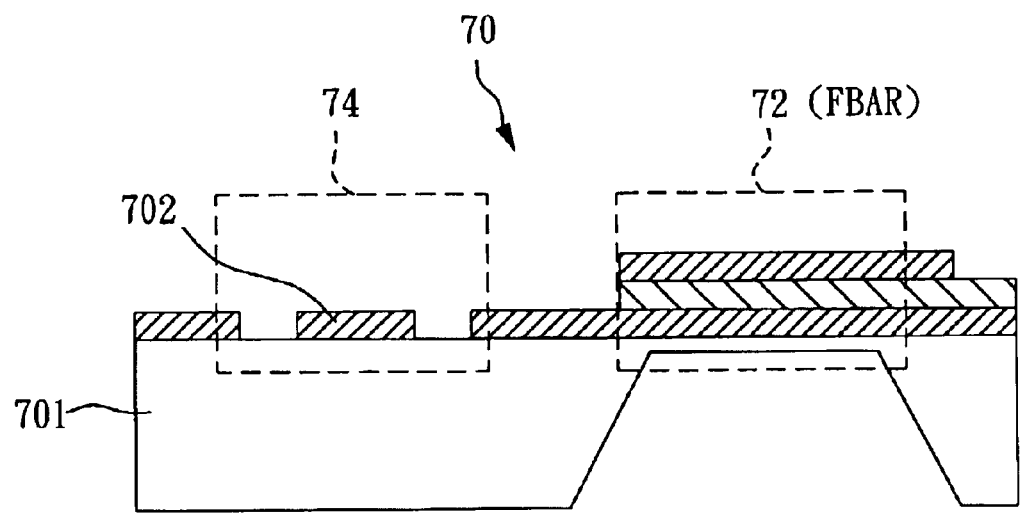
FIG. 7A is a side view of the film bulk acoustic device with integrated trimmable device in accordance with the fourth embodiment of the present invention.
Figure 7B:
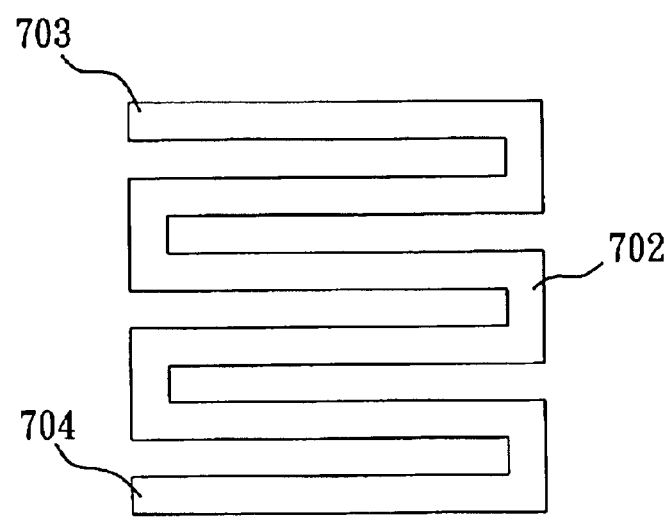
FIG. 7B is a top view of the meander type inductor in accordance with the fourth embodiment of the present invention.

Referring to FIG. 7A, a film bulk acoustic device 70 having integrated trimmable device in accordance with the fourth embodiment of the present invention comprises a FBAR 72 and an integrated trimmable device 74, being integrated on the left side of the FBAR 72. Provided on a common substrate 701, the integrated trimmable device 74 has a meander type inductor 702 (See FIG. 7B), being formed of a electrode material and having its inductance measured across the first end 703 and the second end 704. Having a relationship with the geometrical shape of the meander type inductor 702, the inductance of the integrated trimmable device 74 can be adjusted by trimming the area of the meander type inductor 702 until the film bulk acoustic device 70 having integrated trimmable device achieves the target resonance frequency.

Figure 9:
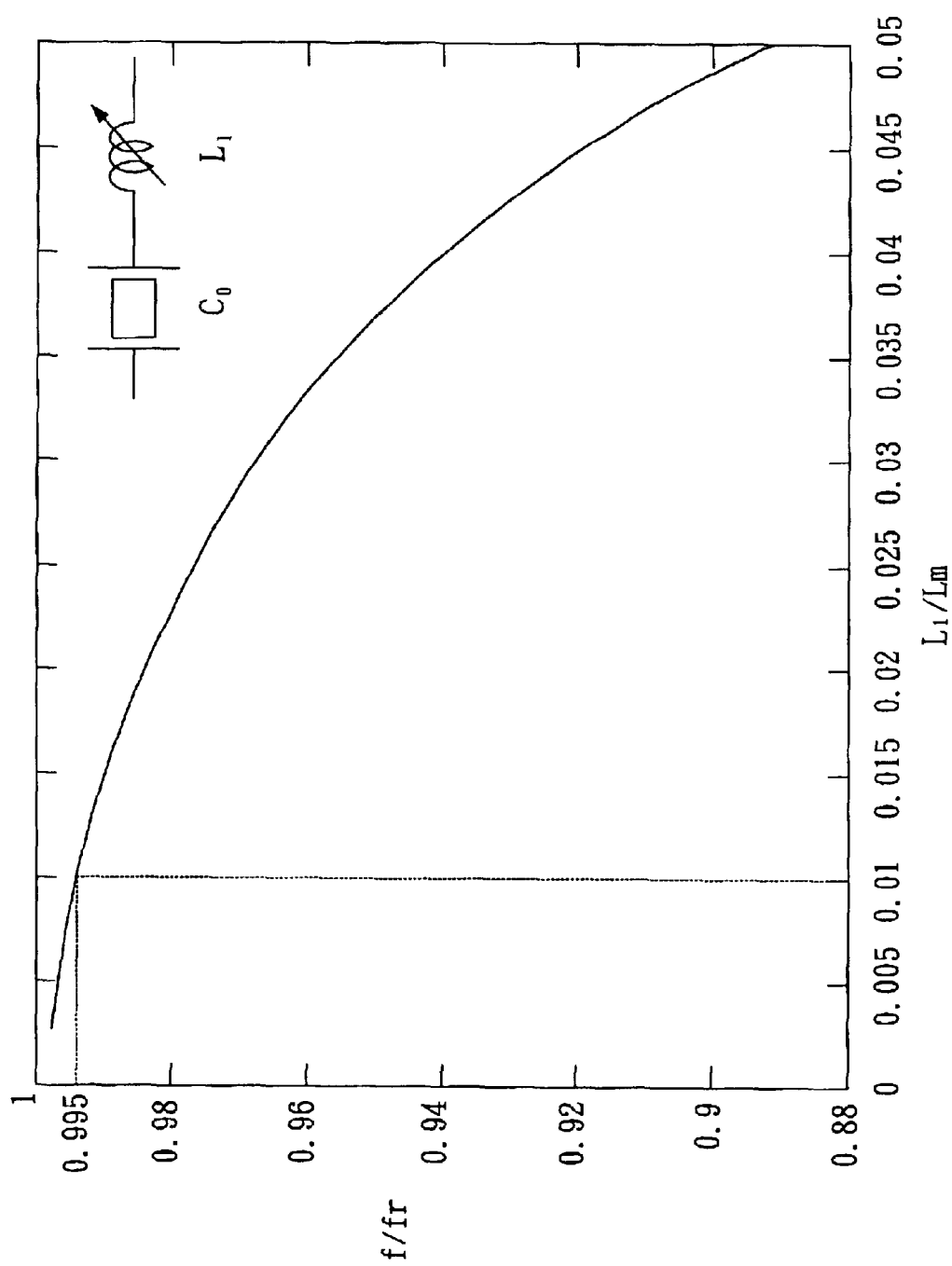
FIG. 9 shows the normalized resonance frequency curve of the film bulk acoustic device having integrated trimmable device in accordance with the third and fourth embodiment of the present invention.

FIG. 9 shows the normalized resonance frequency curve of the film bulk acoustic device 60 and 70 having integrated trimmable device in accordance with the third and fourth embodiment of the present invention. The vertical axis represents the normalized resonance frequency f/fr, f and fr being the resonance frequency of the film bulk acoustic device 60 or 70 and the FBAR 62 or 72, respectively. The horizontal axis represents the ratio of $L_1/L_m$, $L_1$ and $L_m$ being the inductance of the integrated trimmable device 64 or 74 and the equivalent inductance of the equivalent circuit the FBAR 62 or 72, respectively. As the ratio of $L_1/L_m$ lowers to 0.01, the corresponding normalized resonance frequency f/fr becomes 0.994, meaning a 0.6% drop by the resonance frequency f of the film bulk acoustic device 60 or 70 in reference to the resonance frequency fr of the FBAR 62 or 72. By trimming the inductance $L_1$ of the integrated trimmable device 64 or 74 or the equivalent inductance $L_m$ of the equivalent circuit the FBAR 62 or 72 so as to alter the ratio of $L_1/L_m$ and f/fr until the film bulk acoustic device 60 or 70 achieves the target resonance frequency f. The inductance $L_1$ of the integrated trimmable device 74 is measured across the first end 703 and the second end 704 of the meander type inductor 702. The equivalent inductance $L_m$ of the equivalent circuit the FBAR 72 is measured across the upper electrode (not shown) and the lower electrode (not shown).

The first and second embodiment and the third and fourth embodiment of the present invention illustrate a film bulk acoustic device having integrated trimmable capacitor and inductor, respectively. The fifth and sixth embodiment of the present invention will demonstrate a film bulk acoustic device having integrated parallel-plate actuators and comb drive electrostatic tunable device, respectively.

Fifth Preferred Embodiment

Figure 10:
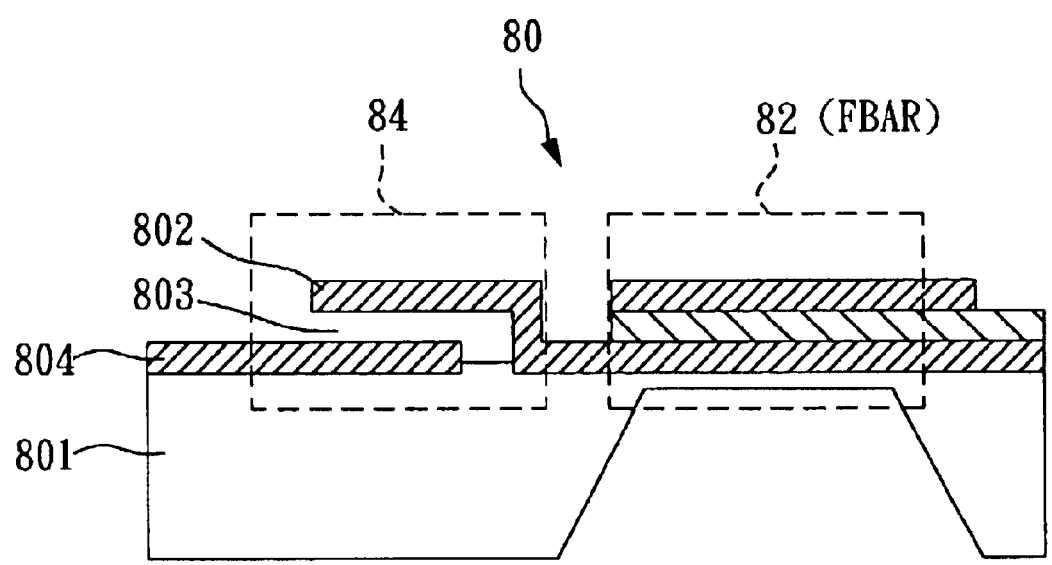
FIG. 10 is a side view of the film bulk acoustic device with integrated tunable device in accordance with the fifth embodiment of the present invention.

Referring to FIG. 10, a film bulk acoustic device 80 having integrated tunable device in accordance with the fifth embodiment of the present invention comprises a FBAR 82 and an integrated tunable device 84, being integrated on the left side of the FBAR 82. Being provided on a common substrate 801, the integrated tunable device 84 has an upper electrode 802, a vacant layer 803 and a lower electrode 804. As a voltage differential is applied across the upper electrode 802 and the lower electrode 804, the upper electrode 802 will move by electrostatic force toward the lower electrode 804, being in electrode with the common substrate 801, so as to reduce the gap and raise the capacitance between them until the film bulk acoustic device 80 having integrated tunable device achieves the target resonance frequency.

Sixth Preferred Embodiment

Figure 1A:
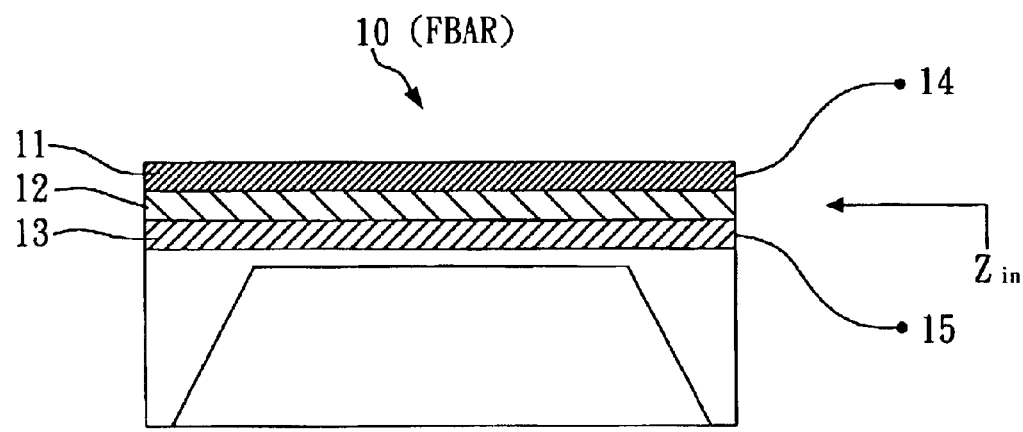
FIG. 1A is a side view of prior art FBAR.
Figure 1B:
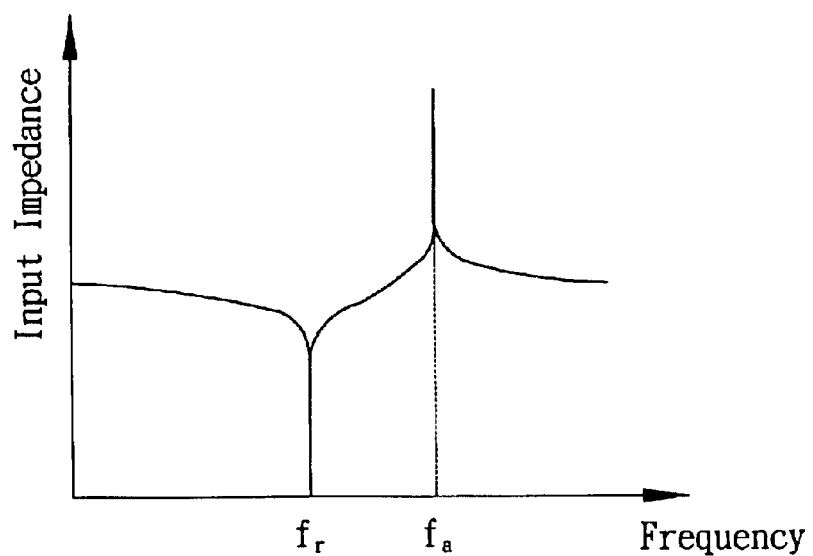
FIG. 1B is an input impedance curve of a FBAR 10 as a function of alternating voltage, $f_r$ and $f_a$ being resonance frequency and anti-resonance frequency, respectively.
Figure 2A:
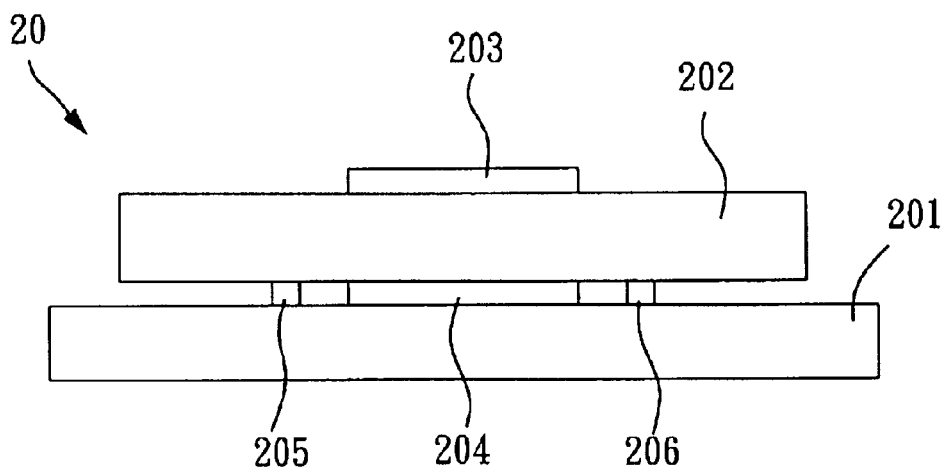
FIG. 2A is a side view of prior art FBAR featuring resistive heating in accordance with U.S. Pat. No. 5,873,153.
Figure 2B:
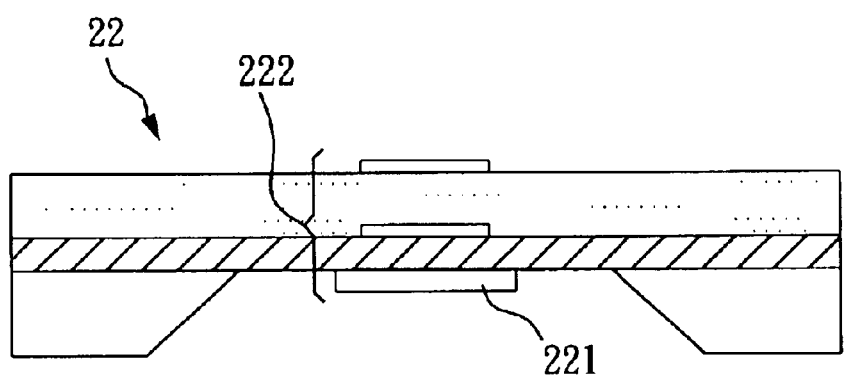
FIG. 2B is a side view of prior art FBAR featuring a conductor having a high resistivity in accordance with U.S. Pat. No. 5,873,153.
Figure 3:
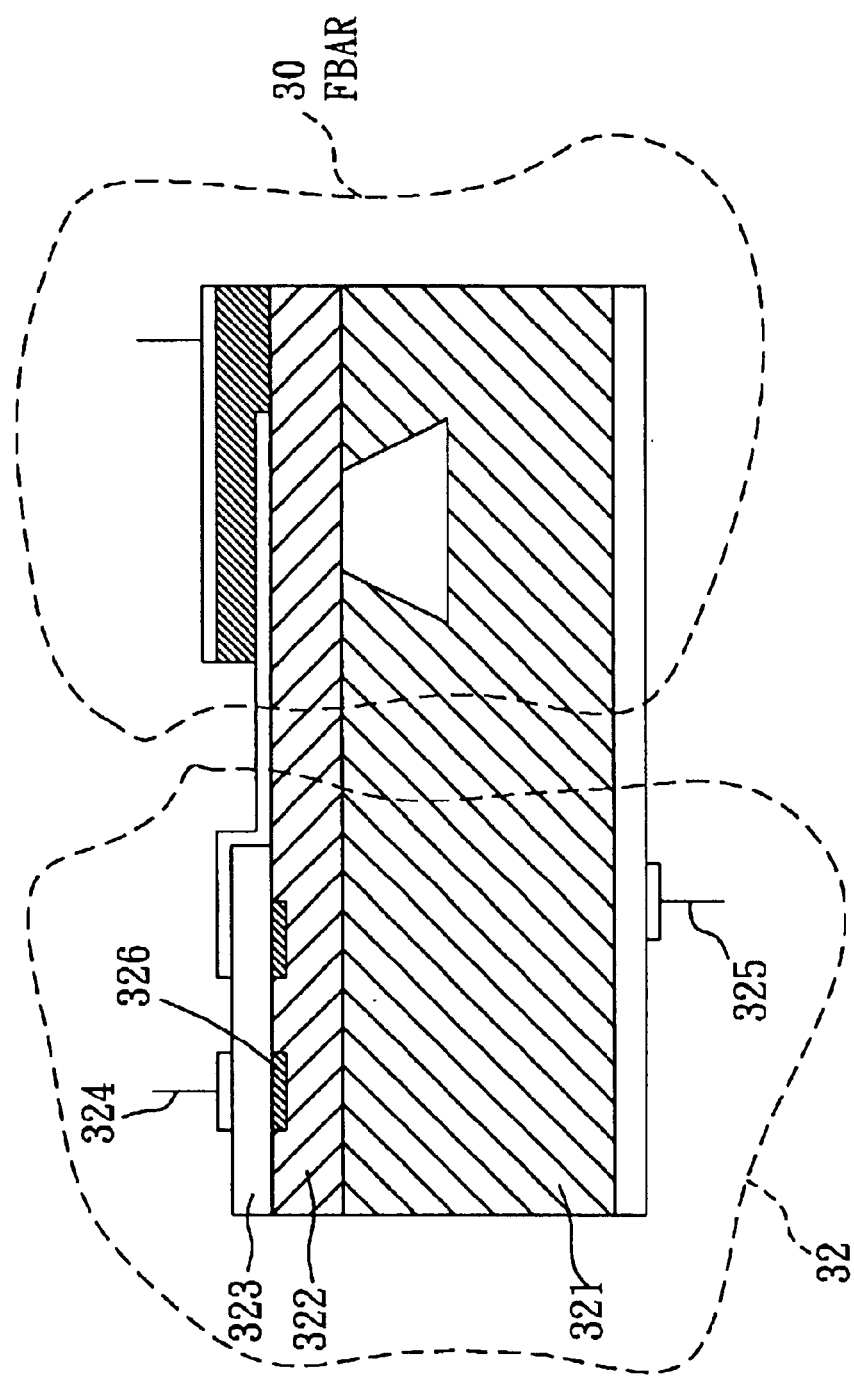
FIG. 3 is a side view of prior art integrated tunable resonator for use in Oscillators and Filters featuring in accordance with U.S. Pat. No. 5,166,646.
Figure 11:
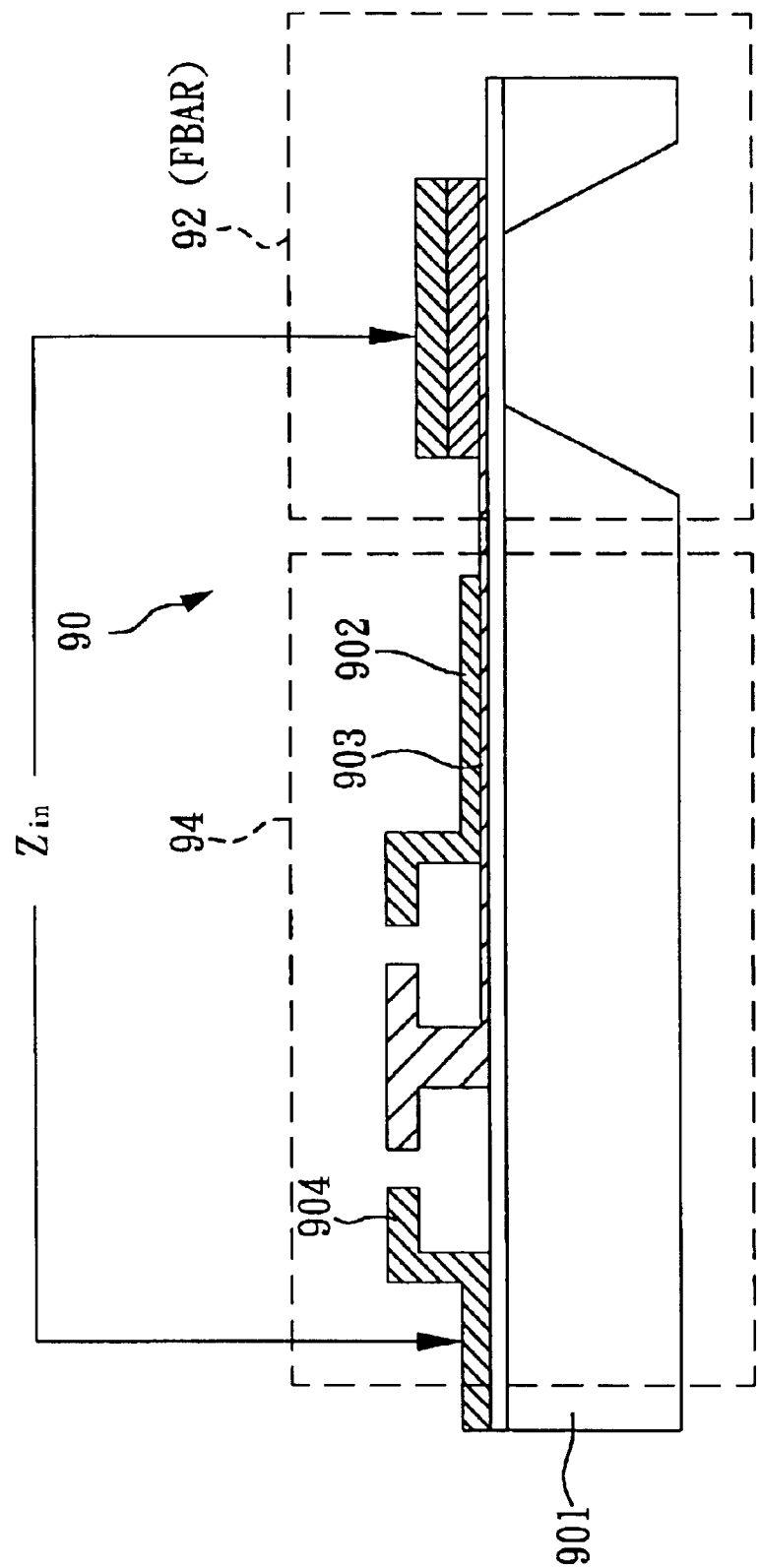
FIG. 11 is a side view of the film bulk acoustic device with integrated tunable device in accordance with the sixth embodiment of the present invention.
Figure 12:
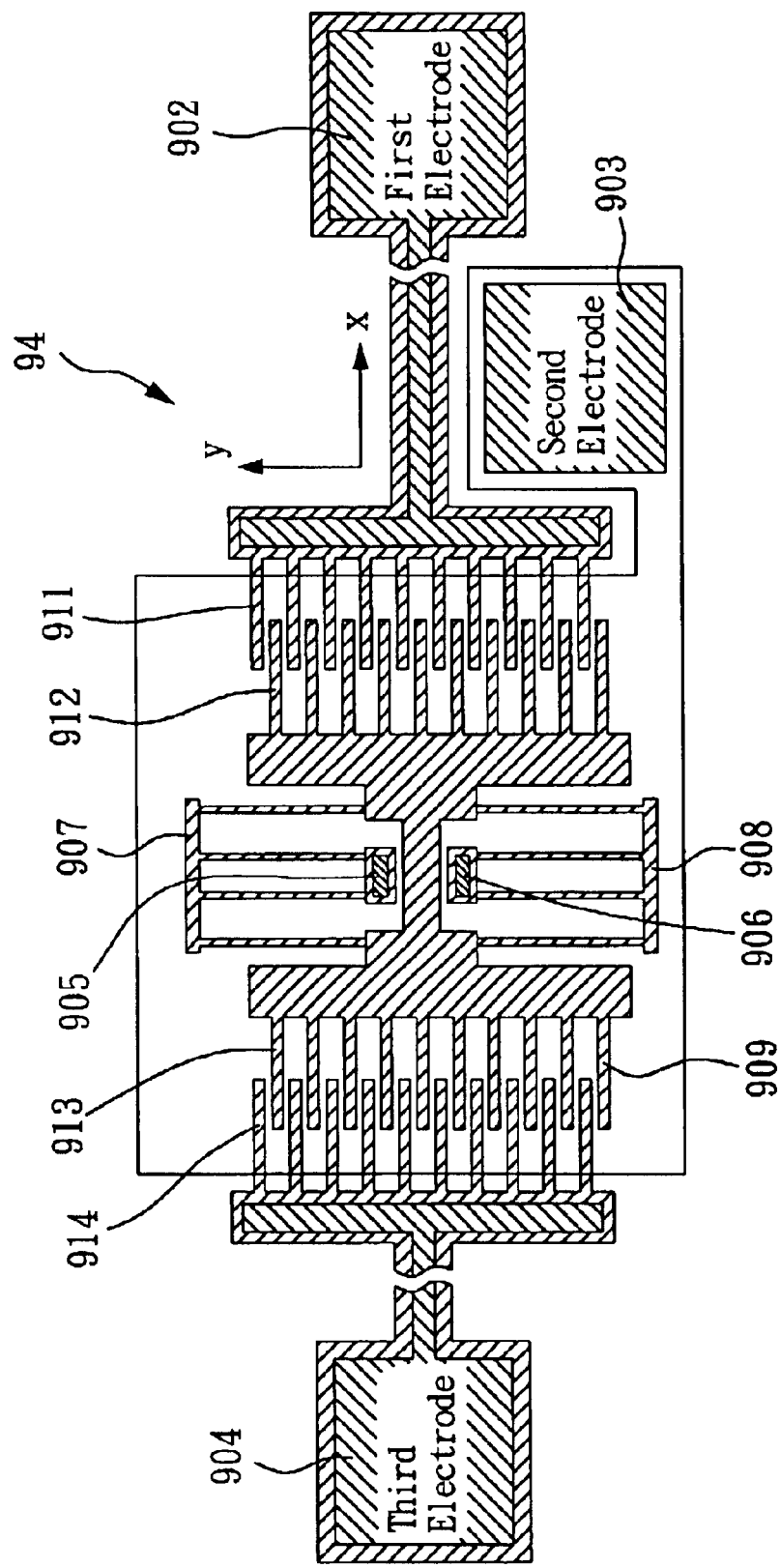
FIG. 12 is a top view of the film bulk acoustic device with integrated tunable device in accordance with the sixth embodiment of the present invention.
Figure 13:
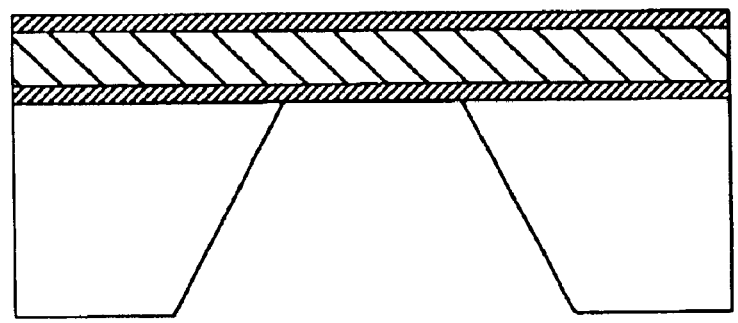
FIG. 13 is a side view of the film bulk acoustic device with integrated tunable and trimmable device fabricated by back-side etching in accordance with the first through sixth embodiment of the present invention.
Figure 14:
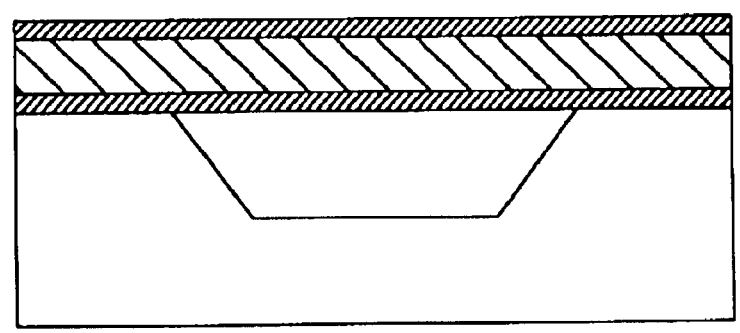
FIG. 14 is a side view of the film bulk acoustic device with integrated tunable and trimmable device fabricated by front-side etching in accordance with the first through sixth embodiment of the present invention.

Referring to FIG. 11 and FIG. 12 showing a side view and the top view, respectively, a film bulk acoustic device 90 having integrated tunable device in accordance with the sixth embodiment of the present invention comprises a FBAR 92 and an integrated tunable device 94, being an electrostatic comb type tunable device integrated on the left side of the FBAR 92. Provided on a common substrate 901, the integrated tunable device 94 has a first electrode 902 connected with a first comb unit 911, a second electrode 903 connected with a first anchor 905 and a second anchor 906 via a hidden layer, and a third electrode 904. The first anchor 905 and the second anchor 906 are connected with a first suspension unit 907, being further connected with a second comb unit 912, and a second suspension unit 908, being further connected with a third comb unit 913, respectively. A third electrode 904 is connected with a fourth comb unit 914. The comb units 911 through 914 have a suspension structure, respectively. As a voltage differential is applied across the first electrode 902 and the second electrode 903, the second comb unit 912 will move toward the first comb unit 911, being connected with the first electrode 902, so as to raise the gap between the third comb unit 913 and the fourth comb unit 914 and reduce the capacitance between the second electrode 903 and the third electrode 904, thereby raising the resonance frequency $f_r$ (See FIG. 1B) until the film bulk acoustic device 90 having integrated tunable device achieves the target resonance frequency.

The FBARs 42, 52, 62, 72, 82 and 92 as shown in FIGS. 4, 5A, 6A, 7A, 10 and 11 in accordance with the first, second, third, fourth, fifth and sixth embodiment, respectively, are fabricated by back-side etching. Front-side etching may also be a valid fabricating option for the FBARs 42, 52, 62, 72, 82 and 92.

Capable of resolving the deficiencies of U.S. Pat. No. 5,873,153, U.S. Pat. No. 6,051,907 and U.S. Pat. No. 5,166,646, providing common components such as common substrates 401, 501, 601, 701, 801 and 901 and integrated lower electrodes 404, 504, 604 and 804, as well as offering the advantages of tunable and trimmable device, the film bulk acoustic devices having integrated tunable or trimmable devices disclosed in the present invention can thus achieve the target resonance by tuning or trimming the integrated tunable or trimmable devices.

For various applications, a film bulk acoustic device with integrated tunable and trimmable device may be the combination of any trimmable device declared in the first through fourth preferred embodiments and any of the tunable device disclosed in the fifth and sixth preferred embodiments.

While the invention has been described in terms of several preferred embodiments, various alternatives and modifications can be devised by those skilled in the art without departing from the invention. Accordingly, the present invention is intended to embrace all such alternatives that fall within the scope of the claims.

What is claimed is:

1. A film bulk acoustic device having integrated trimmable device, comprising:
   a FBAR being provided on a common substrate and having an upper electrode, a lower electrode and a first piezoelectric layer between the upper electrode and the lower electrode, an equivalent circuit between the upper electrode and the lower electrode having an equivalent inductance; and
   an integrated trimmable device, being provided on the common substrate beside the FBAR and having a electrode, the first end of the electrode being provided on the common substrate and connected with the FBAR and being extended to become a second end of the electrode, the shape of trimmable device being spiral or meander shape;
   wherein the equivalent inductance of the equivalent circuit of at least one of integrated trimmable device and the FBAR is adjusted by trimming the inductance chosen from the group comprising the second end of the electrode and the upper electrode until the film bulk acoustic device having integrated trimmable device achieves the target resonance frequency.

2. The film bulk acoustic device having integrated trimmable device of claim 1, wherein the electrode of integrated trimmable device is connected with the upper electrode of the FBAR.

3. The film bulk acoustic device having integrated trimmable device of claim 1, wherein the electrode of integrated trimmable device is connected with the lower electrode of the FBAR.

4. The film bulk acoustic device having integrated trimmable device of claim 1, wherein a gap between the first end and the second is a second piezoelectric layer.

5. The film bulk acoustic device having integrated trimmable device of claim 4, wherein the first and the second piezoelectric layer are a common piezoelectric layer.

6. The film bulk acoustic device having integrated trimmable device of claim 1, wherein the gap between the first and second end is choosing from the group comprising a dielectric layer and a vacant layer.

7. The film bulk acoustic device having integrated trimmable device of claim 1, further comprising the means for wafer-level trimming of the integrated trimmable device.

8. The film bulk acoustic device having integrated trimmable device of claim 1, wherein trimming comprises adding and removing means for altering the geometric shape choosing from the group comprising the second end of the electrode and the upper electrode.

9. The film bulk acoustic device having integrated trimmable device of claim 1, wherein the inductance of the integrated trimmable device is measured across the first end of the electrode and the borderline between the electrode and the FBAR.

10. The film bulk acoustic device having integrated trimmable device of claim 1, wherein the equivalent inductance of the equivalent circuit of the FBAR is measured across the upper and lower electrode.

11. The film bulk acoustic device having integrated trimmable device of claim 1, wherein the FBAR may be fabricated by front-side etching as well as back-side etching.

* * * * *